(12) United States Patent
Khayrullin et al.

(10) Patent No.: US 8,975,832 B2
(45) Date of Patent: Mar. 10, 2015

(54) STACKED, NON-INVERTED DIELECTRICALLY ISOLATED, ORGANIC LIGHT EMITTING DIODE DISPLAY FORMED ON A SILICON-ON-INSULATOR BASED SUBSTRATE AND METHOD OF SAME

(75) Inventors: Ilyas I. Khayrullin, Hopewell Junction, NY (US); Amalkumar P. Ghosh, Hopewell Junction, NY (US); Ihor Wacyk, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 643 days.

(21) Appl. No.: 13/411,988

(22) Filed: Mar. 5, 2012

(65) Prior Publication Data

US 2013/0069558 A1 Mar. 21, 2013

Related U.S. Application Data

(60) Provisional application No. 61/450,005, filed on Mar. 7, 2011.

(51) Int. Cl.
- H05B 37/02 (2006.01)
- H01L 51/52 (2006.01)
- H01L 27/32 (2006.01)

(52) U.S. Cl.
CPC ........ *H01L 51/5203* (2013.01); *H01L 27/3209* (2013.01)
USPC ............................ 315/294; 315/334; 315/337

(58) Field of Classification Search
USPC .................................................. 313/513, 521
See application file for complete search history.

(56) References Cited

U.S. PATENT DOCUMENTS

2011/0095702 A1* 4/2011 Lee et al. ...................... 315/294

* cited by examiner

*Primary Examiner* — Long Nguyen
(74) *Attorney, Agent, or Firm* — Epstein Drangel LLP; Robert L. Epstein

(57) ABSTRACT

A display and method of making a display, comprising first and second stacked, non-inverted, dielectrically isolated, organic light emitting diodes formed on a silicon on insulator substrate. The display includes a means for applying both a positive or negative voltage across the stack, and a common intermediate control node situated between the diodes. The control node is electrically connected through vias to receive a control voltage signal, such that altering the relationship between the control voltage signal and the voltage applied across the stack regulates the actuation of the individual diodes.

11 Claims, 2 Drawing Sheets

STACKED, NON-INVERTED DIELECTRICALLY ISOLATED, ORGANIC LIGHT EMITTING DIODE DISPLAY FORMED ON A SILICON-ON-INSULATOR BASED SUBSTRATE AND METHOD OF SAME

CROSS-REFERENCE TO RELATED APPLICATION

This application claims the benefit of provisional patent application Ser. No. 61/450,005 filed in the United States Patent and Trademark Office on Mar. 7, 2011.

BACKGROUND OF THE INVENTION

1. Field of the Invention

This invention relates generally to organic light emitting diodes (OLEDs) and more particularly to a method of making a stacked, non-inverted, dielectrically isolated, organic light emitting diode display using a silicon-on-insulator (SOI) based active matrix backplane.

2. Description of the Related Art

The present invention is an OLED display, which uniquely utilizes a SOI substrate in place of a conventional silicon substrate for allowing the stacked OLEDs to be driven in reverse and thus conveying both positive and negative voltage through the bulk.

An OLED device typically includes a stack of thin layers formed on a substrate. A light-emitting layer of a luminescent organic solid, as well as adjacent semiconductor layers, are sandwiched between a cathode and an anode. The light-emitting layer may be selected from any of a multitude of fluorescent and phosphorescent organic solids. Any of the layers, and particularly the light-emitting layer, also referred to herein as the emissive layer or the organic emissive layer, may consist of multiple sublayers.

The SOI substrate, or silicon wafer herein also referred to as a backplane, is unique in that the silicon junction is above the electrical insulator.

In an OLED device, one or more layers of semiconducting organic material are sandwiched between two electrodes. An electric current is applied across the device, causing negatively charged electrons to move into the organic material(s) from the cathode. Positive charges, typically referred to as holes, move in from the anode. The positive and negative charges meet in the center layers (i.e., the semiconducting organic material), combine, and produce photons. The wavelength—and consequently the color—of the photons depends on the electronic properties of the organic material in which the photons are generated. In the present invention, the presence of SOI technology allows the electric current to move in reverse, or from a plus to a minus range and vice versa.

Prior art OLED display technology utilizes an active matrix backplane using conventional silicon technology with the limited option of conveying only positive voltage through the bulk. While these units may be suitable for the particular purpose employed, or for general use, they would not be as suitable for the purposes of the present invention as disclosed hereafter.

The OLED display of the present invention utilizes a new OLED architecture with multiple units stacked in sequence with intermediate electrodes electrically connected through vias.

A "via" is a vertical electrical connection between different layers of conductors in a physical electronic circuit. Vias have been described in detail and their use disclosed in a plurality of prior art patents. Specifically, U.S. Patent Publication Nos. 2004/0207315, 2005/0236981, 2010/0295443, and U.S. Pat. Nos. 7,384,816, and 6,885,157 disclose the use of vias in OLED technology. In particular, paragraph [0052] of publication 2004/0207315, describes vias in use with OLED display devices.

In the present invention, electrical connections to and from OLED displays are provided to each anode line and cathode line by a plurality of vias. Each via is formed of a column of conductive material or in its simplest form provided as an opening leaving free access to the electrode beneath.

The proposed stacked OLED of the present invention requires application of a voltage that is both positive and negative with respect to the control node. This is not physically possible with conventional bulk silicon technology because the active transistor devices in bulk silicon process are electrically isolated using reverse bias depletion junctions. These junctions are all tied to a common voltage at zero volts. Driving a transistor negative with respect to a common substrate potential would forward bias these junctions and render the transistors inoperative. In order to overcome this limitation, a technology with dielectrically isolated transistors is required. Such a technology may be comprised of a thin film transistor material on a glass substrate such as used in large active area displays or a SOI technology as shown and described herein.

It is, therefore, a primary object of the present invention to provide a display and method of making a display comprising a stacked, non-inverted, dielectrically isolated organic light emitting diode formed on a SOI substrate.

It is, therefore, a primary object of the present invention to provide a display and method of making a display comprising a stacked, non-inverted, dielectrically isolated organic light emitting diode formed on a thin film transistor material on a glass substrate.

It is another object of the present invention to allow voltage across an OLED stack to be both positive and negative and thus allow the OLEDs to be driven in reverse.

It is another object of the present invention to provide a method that can be implanted in any type of active matrix OLED display.

It is another object of the present invention to provide a method for use in a micro-display that will allow for the reduction of pixel dimensions and enhancement of resolution.

BRIEF SUMMARY OF THE INVENTION

In accordance with one aspect of the present invention, a stacked, non-inverted, dielectrically isolated, organic light emitting diode display using a silicon-on-insulator (SOI) based active matrix backplane is presented. The display includes first and second diodes stacked and a means for applying a voltage across the stack. A common intermediate control node situated between the diodes is electrically connected through vias to receive a control voltage signal. Altering the relationship between the control voltage signal and the voltage applied across the stack regulates the actuation of the individual diodes. In addition, the voltage applied across the stack may be both positive and negative, or simply negative, in relation to the control voltage signal. When the voltage applied across the first or second diodes is either positive or negative in relation to the control voltage signal, the individual diodes are independently actuated. When the voltage applied across the first or second diodes is equal to the control voltage signal, the individual diodes are not actuated. The silicon on insulator substrate may also be comprised of a thin film transistor material on a glass substrate.

In accordance with an additional aspect of the present invention, a method of actuating first and second stacked, non-inverted, dielectrically isolated, organic light emitting diodes, include the first step of forming the diodes on a silicon on insulator substrate or thin film transistor material on a glass substrate. Next, a positive or negative voltage is applied across the stacks. Then, a common intermediate control node is situated between the diodes. The control node is electrically connected through vias to receive a control voltage signal. Finally, altering the relationship between the control voltage signal and the voltage applied across the stacks independently actuates the corresponding diodes. The voltage applied across the stacks may be either positive or negative in relation to the control voltage signal. Specifically, actuating the individual diodes independently occurs when the voltage applied across the first or second stack is either positive or negative in relation to the control voltage signal. The individual diodes are independently turned off when the voltage applied across the first or second stack is equal to said control voltage signal.

BRIEF DESCRIPTION OF THE SEVERAL VIEWS OF THE DRAWINGS

To these and to such other objects that may hereinafter appear, the present invention related to a stacked, non-inverted, dielectrically isolated OLED display as described in detail in the following specification and recited in the annexed claims, taken together with the accompanying drawings, in which like numerals refer to like parts in which:

To the accomplishment of the above and related objects the invention may be embodied in the form illustrated in the accompanying drawings. Attention is called to the fact, however, that the drawings are illustrative only. Variations are contemplated as being part of the invention, limited only by the scope of the claims.

DETAILED DESCRIPTION OF THE INVENTION

Figure 1:
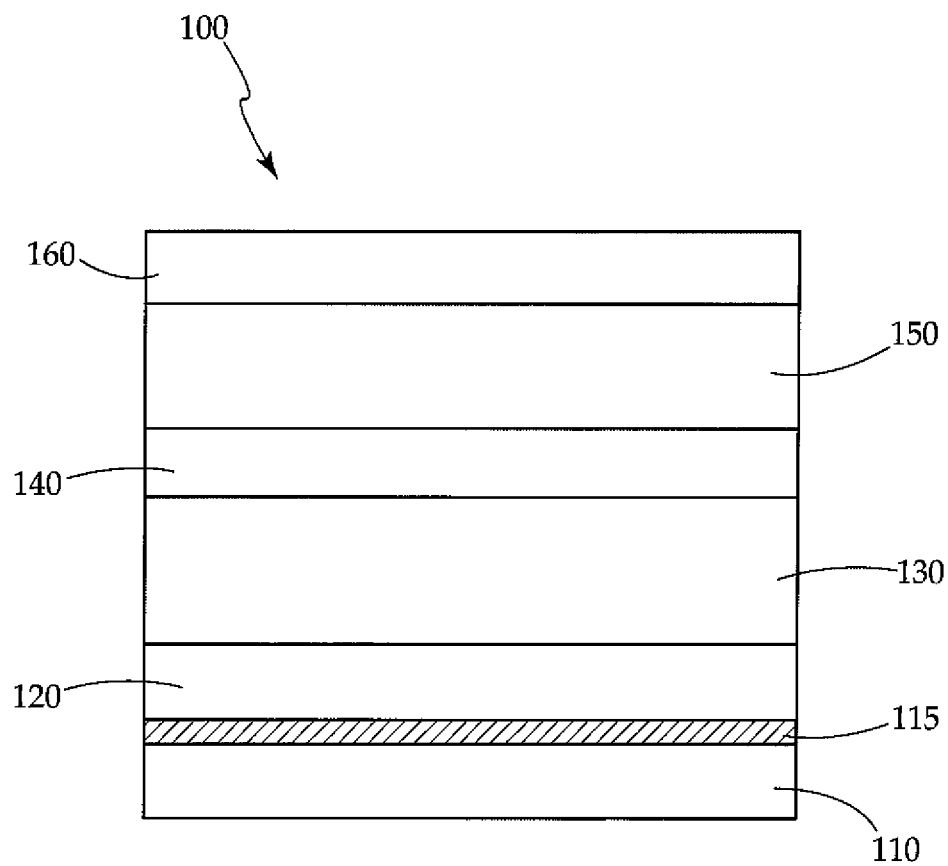
FIG. 1 is a schematic cross-sectional view of a conventional OLED device in accordance with the preferred embodiment.

FIG. 1 illustrates a schematic cross-sectional view of a conventional stacked OLED display 100 in accordance with the preferred embodiment of the present invention.

OLED display 100 shown in the schematic includes a reflective top anode (second anode 160) and a transparent bottom anode (first anode 120) on a glass substrate (transparent substrate 110) with a transparent cathode (cathode 140) between two OLED units (first OLED intermediate layers 130 and second OLED intermediate layers 150).

For purposes of the present display, the transparent substrate 110 includes a thin film transistor material 115 incorporated thereon, such as used in large area active displays or with SOI technology. Specifically, it is preferred that the two emissive units are connected in non-inverted sequence, however it is contemplated herein that a similar application in inverted sequence is possible when a SOI based active matrix backplane is used. Unlike conventional Si technology, where only positive voltage is conveyed throughout the bulk, the present stacked OLED 100 invention is able to convey an application of voltage that is both positive and negative with respect to the second electrode voltage.

The terms above, below, top and bottom are relative terms used with respect to FIG. 1, and do not preclude the structure of OLED display 100 being inverted, non-inverted, with multiple units stacked in a variety of sequences or oriented in any other possible way. In addition, the present OLED 100 is contemplated with multiple units stacked in sequence with intermediate electrodes electrically connected through vias.

OLED display 100 may be formed in several possible ways, including building up layers from a bottom layer. Alternative layering combinations are possible in OLED display 100, and in particular different combinations of OLED devices are able to be stacked in preferred embodiments. For instance, more than two OLED devices may be stacked in preferred embodiments, in which the additional OLED devices have a common intermediate control electrode. Furthermore, other combinations of single color and hybrid OLED displays are possible, depending on the desired output of OLED display 100. Additionally, other OLED apparatuses may be stacked adjacent to OLED display 100 and the combination of the stacked OLEDs of OLED display 100 and the single or stacked OLEDs of the adjacent OLED apparatuses may together provide a desired light output.

Figure 2A:
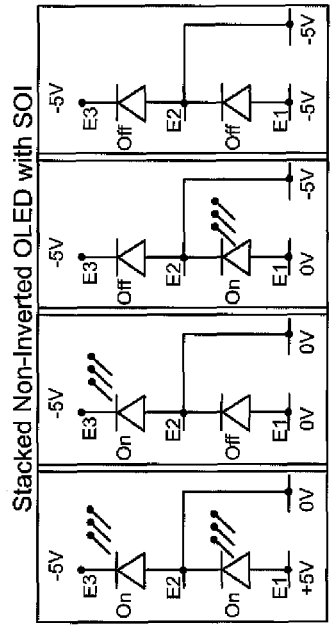
FIG. 2A is an electrical diagram illustrating a stacked non-inverted OLED without SOI technology.
Figure 2B:
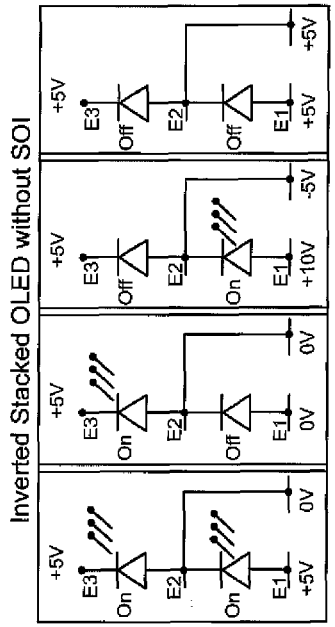
FIG. 2B is an electrical diagram illustrating a stacked non-inverted dielectrically isolated OLED with SOI technology, and forms the basis of the present application.
Figure 2C:
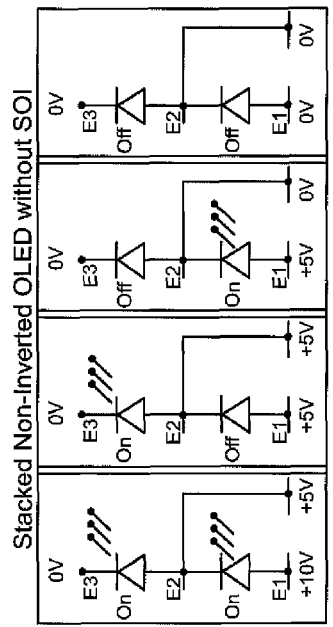
FIG. 2C is an electrical diagram illustrating a stacked non-inverted OLED without SOI technology.
Figure 2D:
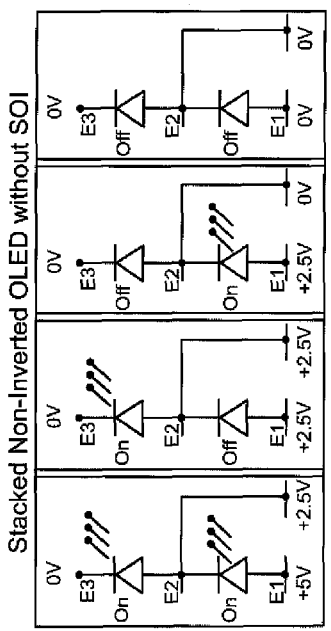
FIG. 2D is an electrical diagram illustrating an inverted stacked OLED without SOI technology.

FIGS. 2A-2D illustrate schematic diagrams of OLED displays with and without the combination of SOI technology. In particular, FIGS. 2A and 2C illustrate a stacked non-inverted OLED without SOI technology. FIG. 2B illustrates a stacked non-inverted OLED with SOI technology. FIG. 2D illustrates an inverted stacked OLED without SOI technology. FIGS. 2A, 2C and 2D illustrate the limitations of voltage across the stack apparent with current OLED displays that lack the addition of SOI technology. FIG. 2B illustrates the preferred embodiment of the present invention, and the voltage driven advantages for a display utilizing the SOI technology.

For comparison purposes, FIGS. 2A-2D all illustrate stacked, non-inverted OLEDs. Here, a first diode and a second diode are between a first electrode E1 and a third electrode E3. A second electrode E2, or common intermediate control node, is positionable between the first and second diodes and electrically connected through vias to receive a control voltage signal. The display of the present invention includes a means for applying voltage across the stack from the first electrode E1 to the third electrode E3. In particular in FIG. 2B, the voltage across the OLED may be positive or negative in relation to that of the common intermediate control node E2, such that actuation of the individual diodes are regulated by altering the relationship between said control voltage signal and the voltage applied across the stack.

Specifically, FIG. 2A illustrates a conventional electrical diagram for actuating diodes in a stacked non-inverted OLED display that require voltage of 5V to turn on and emit light. Here, when voltage of 5V across both the first electrode E1 and the second common intermediate control node E2, or the intermediate control node E2 and the third electrode E3 are present the first or second diodes are respectively activated. When voltage across E1 and E2, or E2 and E3 is not 5V the corresponding diodes remain off. Similarly, FIG. 2C illustrates a conventional electrical diagram for actuating diodes in a stacked non-inverted OLED display that require voltage of 2.5V to turn on and emit light. As illustrated when 2.5V is present across the stack from E1 to E2, or E2 to E3, the corresponding diodes turn on and emit light. In both FIGS. 2A and 2C the voltage across the stack must always be positive. This is because of the presence of conventional bulk silicon technology, which utilizes active transistor devices that are electrically isolated using reverse bias depletion junctions that are all tied to a common voltage. Driving a transistor in one of these examples negative would forward bias the junction and render the transistors inoperative.

FIG. 2D is similar in concept to FIG. 2A, however the OLEDs are stacked in inverted sequence and require voltage of 5V to turn on and emit light. When voltage of 5V across both the first electrode E1 and the second common intermediate control node E2, or the intermediate control node E2 and the third electrode E3 are present the first or second diodes are respectively activated. When voltage across E1 and E2, or E2 and E3 is not 5V the corresponding diodes remain off. Similarly, as discussed supra, the presence of conventional bulk silicon technology requires the voltage across the stack to always be positive.

While it is customary in the art to apply voltages across a stack, and conventional to apply 5V or 2.5V for example, new technology is immerging requiring that varying degrees of voltage be applied. Applying varying degrees of voltage across the stack requires modification of the stack, which is inefficient and time consuming, and thus it is increasingly more advantageous to provide a stacked OLED display capable of applying both positive and negative voltage through the bulk without modification.

FIG. 2B illustrates how a stacked non-inverted dielectrically isolated OLED display with SOI backplane technology (or thin film transistor material on a glass substrate) allows voltage across the OLED stack to be positive and negative in relation to that of the common intermediate control node E2, such that actuation of the individual diodes are regulated by altering the relationship between the control voltage signal and the voltage applied across the stack. Here, when voltage of 5V or negative 5V across both the first electrode E1 and the second common intermediate control node E2, or the intermediate control node E2 and the third electrode E3 are present the first or second diodes are respectively activated. When voltage across E1 and E2, or E2 and E3 is not 5V or negative 5V the corresponding diodes remain off. Here, it is simply illustrated that voltages of both plus and minus 5V are present, and it is with the addition of the SOI backplane technology that allows the voltage across the stack to be driven both positive and negative. In FIG. 2B, the voltage across the stack may be both positive and negative, unlike FIGS. 2A, 2C and 2D. This is because of the presence of silicon on insulator technology, which utilizes active transistor devices that are dielectrically isolated. Thus, allowing a transistor in this example to be driven negative or in reverse.

In use, a method of actuating first and second stacked, non-inverted, dielectrically isolated, organic light emitting diodes, include the first step of forming the diodes on a silicon on insulator substrate or thin film transistor material on a glass substrate. Next, a positive or negative voltage is applied across the stacks. Then, a common intermediate control node is situated between the diodes. The control node is electrically connected through vias to receive a control voltage signal. Finally, altering the relationship between the control voltage signal and the voltage applied across the stacks independently actuates the corresponding diodes. The voltage applied across the stacks may be either positive or negative in relation to the control voltage signal. Specifically, actuating the individual diodes independently occurs when the voltage applied across the first or second stack is either positive or negative in relation to the control voltage signal. The individual diodes are independently turned off when the voltage applied across the first or second stack is equal to said control voltage signal.

It will now be appreciated the present invention relates to a stacked, non-inverted, dielectrically isolated, organic light emitting diode display and method of fabricating same. The invention is illustrated by example in the drawing figures, and throughout the written description.

It should be understood that numerous variations are possible, while adhering to the inventive concept. Such variations are contemplated as being a part of the present invention.

While only a limited number of preferred embodiments of the present invention have been disclosed for purposes of illustration, it is obvious that many modifications and variations could be made thereto. It is intended to cover all of those modifications and variations, which fall within the scope of the present invention as defined by the following claims.

We claim:

1. A display comprising first and second stacked, non-inverted, dielectrically isolated, organic light emitting diodes formed on a silicon on insulator substrate, means for applying a voltage across said stack, a common intermediate control node situated between said diodes, said control node being electrically connected through vias to receive a control voltage signal, such that the actuation of the individual diodes is regulated by altering the relationship between said control voltage signal and said voltage applied across said stack.

2. The display of claim 1, wherein the voltage applied across the stack is both positive and negative in relation to the control voltage signal.

3. The display of claim 1, wherein the voltage applied across the stack is negative in relation to the control voltage signal.

4. The display of claim 2, wherein the individual diodes are independently actuated when the voltage applied across the first or second diodes is either positive or negative in relation to the control voltage signal.

5. The display of claim 2 or 3, wherein the individual diodes are not actuated when the voltage applied across the first or second diodes is equal to said control voltage signal.

6. The display of claim 1, wherein the silicon on insulator substrate is comprised of a thin film transistor material on a glass substrate.

7. A method of actuating first and second stacked, non-inverted, dielectrically isolated, organic light emitting diodes, the steps comprising:
   a) forming said diodes on a silicon on insulator substrate;
   b) applying a positive or negative voltage across said stacks;
   c) situating a common intermediate control node between said diodes by electrically connecting through vias to receive a control voltage signal; and
   d) actuating the diodes by altering the relationship between said control voltage signal and said voltage applied across said stack.

8. The method of claim 7, the steps further comprising applying a voltage across the stack that is either positive or negative in relation to the control voltage signal.

9. The method of claim 7, wherein actuating the individual diodes independently occurs when the voltage applied across the first or second diodes is either positive or negative in relation to the control voltage signal.

10. The method of claim 7, wherein the individual diodes are independently turned off when the voltage applied across the first or second diodes is equal to said control voltage signal.

11. The method of claim 7, wherein the silicon on insulator substrate is a thin film transistor material on a glass substrate.

* * * * *